(12) United States Patent
Mallinson (10) Patent No.: US 9,323,959 B2
(45) Date of Patent: Apr. 26, 2016

(54) BUFFER-LESS ROTATING COEFFICIENT FILTER

(71) Applicant: ESS Technology, Inc., Fremont, CA (US)

(72) Inventor: A. Martin Mallinson, Kelowna (CA)

(73) Assignee: ESS Technology, Inc., Fremont, CA (US)

( * ) Notice: Subject to any disclaimer, the term of this patent is extended or adjusted under 35 U.S.C. 154(b) by 363 days.

(21) Appl. No.: 13/848,272

(22) Filed: Mar. 21, 2013

(65) Prior Publication Data

US 2013/0254253 A1  Sep. 26, 2013

Related U.S. Application Data

(60) Provisional application No. 61/613,912, filed on Mar. 21, 2012.

(51) Int. Cl.
| | |
|---|---|
| *G06G 7/625* | (2006.01) |
| *G06G 7/02* | (2006.01) |
| *H03H 15/00* | (2006.01) |

(52) U.S. Cl.
CPC ............... *G06G 7/02* (2013.01); *G06G 7/625* (2013.01); *H03H 15/023* (2013.01)

(58) Field of Classification Search
CPC   G06G 7/625; H03H 21/0001; H03H 21/0007
See application file for complete search history.

(56) References Cited

U.S. PATENT DOCUMENTS

| | | | | |
|---|---|---|---|---|
| 5,563,819 | A  * | 10/1996 | Nelson ......................... | 708/819 |
| 6,125,155 | A  * | 9/2000 | Lesthievent et al. .......... | 375/350 |
| 8,362,828 | B2 * | 1/2013 | Riley et al. .................... | 327/553 |
| 8,937,506 | B2 * | 1/2015 | Mallinson ..................... | 327/554 |
| 2013/0015995 | A1 * | 1/2013 | Mallinson ..................... | 341/153 |

\* cited by examiner

*Primary Examiner* — Chuong D Ngo
(74) *Attorney, Agent, or Firm* — Gard & Kaslow LLP (57) ABSTRACT

A circuit that provides a rotating coefficient FIR filter with all necessary coefficient sets present at the same time, without the need for delay elements, devices providing for adjustable impedances, or buffers is described. An input signal is sampled in a round robin fashion by a plurality of switches and capacitors. The capacitors are connected directly to sets of impedance devices. Each set of impedance devices implements the coefficients of the desired frequency response of the filter, adjusted to compensate for the decay of samples in the capacitors between samples. The impedance devices in each set are connected to the capacitors in a different order from each other set, so that each set of impedance devices will produce the desired frequency response when a different one of the capacitor contains a new sample of the input signal. Switches connect the sets of impedance devices to an output and a virtual ground, only one switch being connected to the output at a time to provide the output signal.

14 Claims, 11 Drawing Sheets

(Prior art)

BUFFER-LESS ROTATING COEFFICIENT FILTER

This application claims priority from Provisional Application No. 61/613,912, filed Mar. 21, 2012, which is incorporated herein by reference in its entirety.

FIELD OF THE INVENTION

The present invention relates generally to electronic filters, and more particularly to filters that provide the functionality of finite impulse response (FIR) filters.

BACKGROUND OF THE INVENTION

A finite impulse response (FIR) filter is a type of electronic filter with a broad range of applications. FIR filters are widely used in both digital signal processing and digital video processing, and their construction is well known in the prior art.

One type of FIR filter is a transversal filter, or tapped delay line filter, in which successively delayed versions of an input signal are multiplied by certain coefficient values and then summed. The output of such a filter is thus a weighted combination of voltages taken from uniformly spaced taps.

Figure 1:
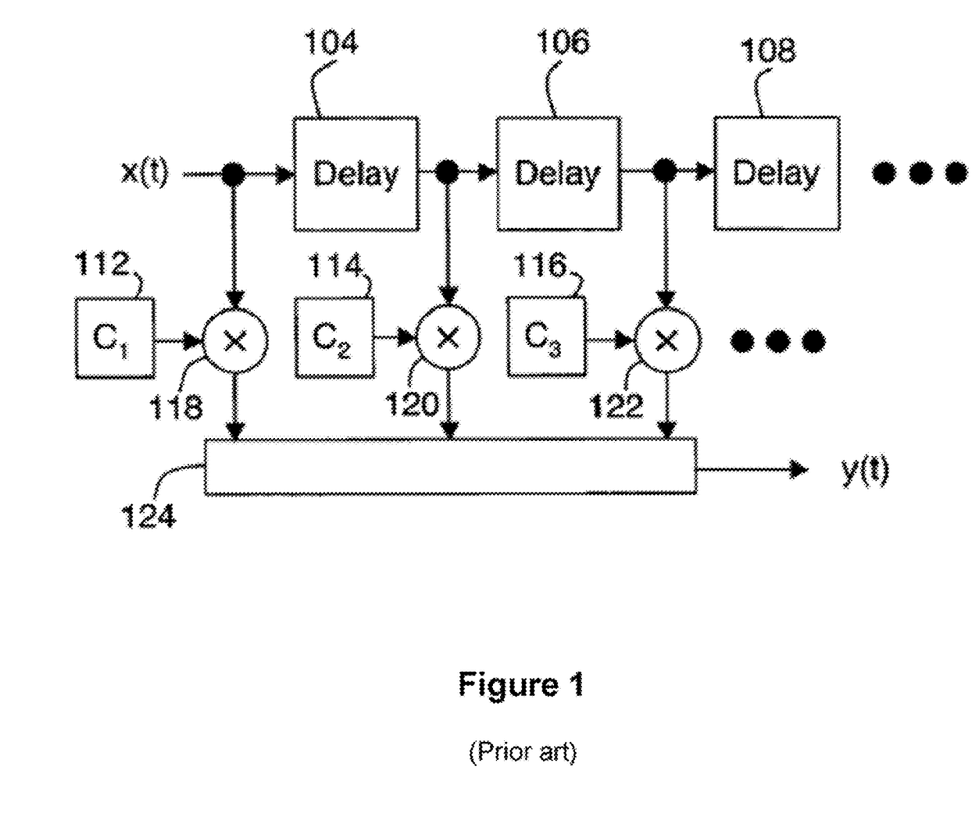
FIG. 1 is a block diagram of one embodiment of a prior art FIR filter.

FIG. 1 shows one example of such a FIR filter, taken from U.S. Pat. No. 7,188,135. An input signal x(t) is fed to a line of delay elements 104, 106, 108, etc., each of which introduces a delay of a predetermined time such that the output of delay element 104 is the input signal x(t−1), the output of delay element 106 is x(t−2), etc. The original signal x(t) is multiplied by a coefficient $C_1$, and each subsequent delayed version of the input signal x(t) is multiplied by a coefficient $C_2$, $C_3$, etc. Element 124 is a summation means that adds all of the delayed and multiplied signals to create output y(t). Such a filter is considered to be of the Mth order, where M−1 is the number of delay elements.

By properly selecting the coefficient values, a FIR filter is designed to provide an output with a desired frequency response. The coefficient values are typically calculated by a software program which takes the desired frequency response as an input.

Figure 2:
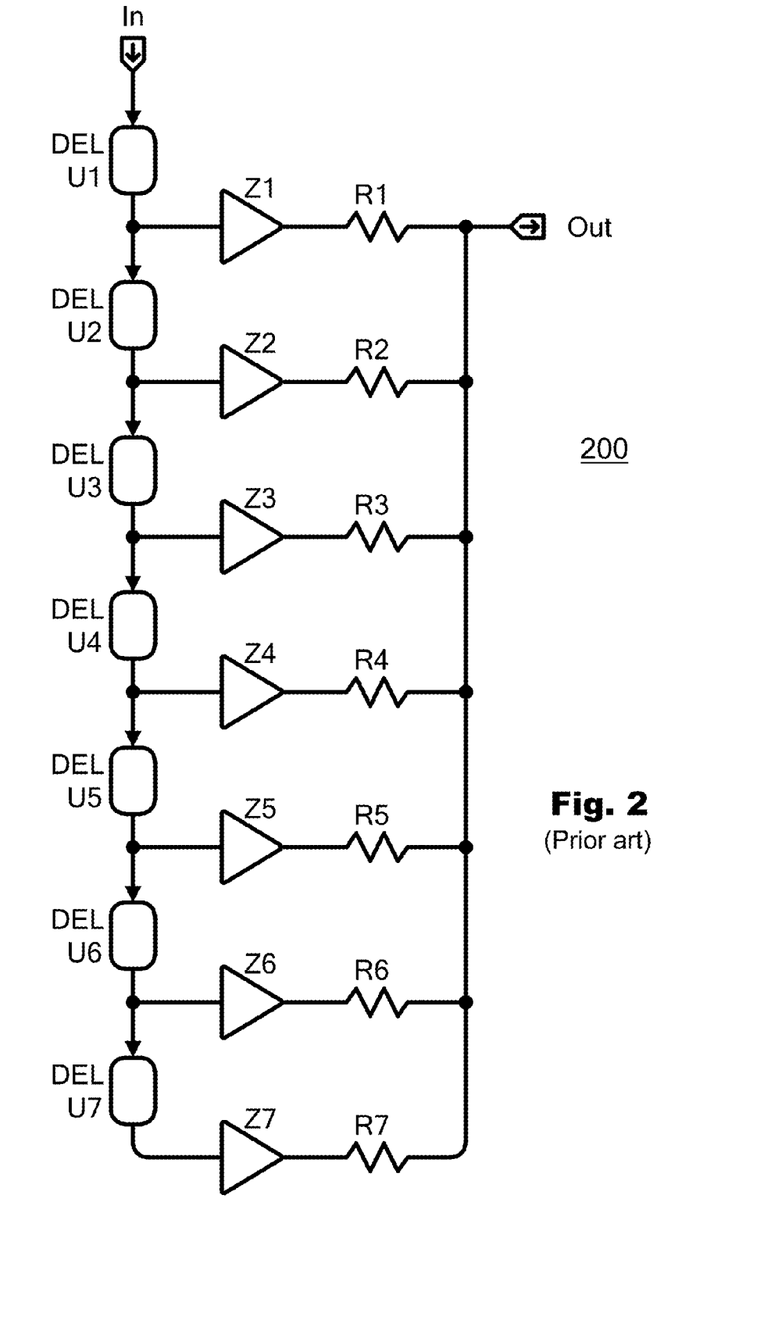
FIG. 2 is a schematic diagram of one embodiment of a prior art FIR filter.

In practice, FIR filters are often made using resistors to provide the coefficients. Such a filter is shown in FIG. 2. Here filter 200 again contains a plurality (7 are shown) of unit delay elements U1 to U7, each of which introduces a predetermined delay of time. As above, the filter is considered to be an $8^{th}$ order filter, since 8 minus 1 is the number of delay elements, although FIR filters may have many more elements when more coefficients are needed to provide the desired frequency response; over 100 coefficients, and thus elements, is not uncommon.

The output of each of the delay elements U1 to U7 is connected to an element having an impedance value, typically through some buffering means, such as buffers Z1 to Z7; here, the elements having impedance values are shown as resistors R1 to R7. One of skill in the art will recognize that while this example and the following discussion use resistors to indicate the impedance values for purposes of illustration, other circuit elements also have impedance values, for example, capacitors, inductors, depletion mode MOSFETs, and other devices, and any device having an impedance that does not otherwise interfere with operation of the filter may be used to provide the desired impedance values as described herein.

The resistors R1 to R7 all share a common output point. As an input signal progresses through the delay elements, each resistor causes the signal on the respective delay element to which it is attached to contribute to the output signal in inverse proportion to the resistor value. Thus, if the resistor is small, the signal on the attached delay element will have a large contribution to the output voltage, while if the resistor is large the contribution to the output will be smaller. It is thus known in the art that by selecting impedance values that are the inverse of the desired coefficients, a circuit as shown in FIG. 2 using resistors or other elements having impedance will effectively provide the multiplication by coefficients shown in FIG. 1.

However, delaying a signal is not an easy operation if the signal is an analog quantity; it typically necessitates not just simple sample and hold devices, or more commonly charge coupled devices (CCDs), but more complex delay elements operating in a chain such that the samples are passed from one delay element to the next. Further, active buffers are typically located between the hold devices (typically capacitors) and the load to isolate the hold devices from the load and prevent signal decay; however, such buffers use additional power. Accordingly, it would be advantageous to be able to build a FIR filter without delay elements and without buffers.

SUMMARY OF THE INVENTION

A circuit is disclosed, that provides a rotating coefficient FIR filter with all necessary coefficient sets present at the same time, without the need for delay elements, devices providing for adjustable impedances, or buffers.

A first embodiment discloses a circuit comprising: an input configured to receive an input signal; a plurality of sampling circuits arranged in parallel for sampling the input signal in response to a timing signal, each sampling circuit consisting of a capacitor and a switch that connects the capacitor to the input signal, the sampling circuits configured such that successive sampling circuits create samples of the input signal in time-delayed succession at pre-determined intervals; a plurality of sets of elements having impedances, each set containing the same number of elements as the number of sampling circuits with the impedances chosen as the inverses of a set of coefficients having values that produces a desired frequency response to the input signal and adjusted to compensate for an exponential decay in the samples such that the coefficients are increased exponentially from the original values at the same rate between successive coefficients as the rate of decay of a sample over one interval, so that the sum of outputs from the elements in each set produces a desired frequency response to the input signal that is the same for each set, with each element in a set connected without a buffer to a different one of the sampling circuits in a different order from the connection of the elements in each other set, such that each set of elements will produce the desired frequency response when a different one of the sampling circuits contains a new sample of the input signal; a plurality of switches, each switch connecting one of the plurality of sets of elements to either a virtual ground of the output or to a ground.

In another embodiment as method is disclosed of designing a finite impulse response filter having a plurality of sampling circuits arranged in parallel for sampling the input signal in response to a timing signal, the sampling circuits configured such that successive sampling circuits create samples of the input signal in time-delayed succession at pre-determined intervals, comprising: selecting a desired frequency response for the filter; selecting a plurality of sets of elements having impedances, each set containing the same number of elements as the number of sampling circuits with the impedances chosen as the inverses, of a set of coefficients having values that produces a desired frequency response to the input signal and adjusted to compensate for an exponential decay in the samples such that the coefficients are increased exponentially from the original values at the same rate between successive coefficients as the rate of decay of a sample over one interval, so that the sum of outputs from the elements in each set produces a desired frequency response to the input signal that is the same for all of the sets, with each element in a set to be connected without a buffer to a different one of the sampling circuits in a different order from the connection of the elements in each other set, such that each set of elements will produce the desired frequency response when a different one of the sampling circuits contains a new sample of the input signal; and for each set of elements, providing a switch connecting the set of elements either to a virtual ground of an output or to a ground, each switch being separate from the switches connected to the other sets of elements.

Another embodiment discloses a computer readable storage medium having embodied thereon instructions for causing a computing device to execute a method for designing a finite impulse response filter having as plurality of sampling circuits arranged in parallel for sampling the input signal in response to a timing signal, the sampling circuits configured such that successive sampling circuits create samples of the input signal in time-delayed succession at pre-determined intervals, the method comprising: an input configured to receive an input signal; a plurality of sampling circuits arranged in parallel for sampling the input signal in response to a timing signal, each sampling circuit consisting of a capacitor and a switch that connects the capacitor to the input signal, the sampling circuits configured such that successive sampling circuits create samples of the input signal in time-delayed succession at pre-determined intervals; a plurality of sets of elements having impedances, each set containing the same number of elements as the number of sampling circuits with the impedances chosen as the inverses of a set of coefficients having values that produces a desired frequency response to the input signal and adjusted to compensate for an exponential decay in the samples such that the coefficients are increased exponentially from the original values at the same rate between successive coefficients as the rate of decay of a sample over one interval, so that the sum of outputs from the elements in each set produces a desired frequency response to the input signal that is the same for each set, with each element in a set connected without a buffer to a different one of the sampling circuits in a different order from the connection of the elements in each other set, such that each set of elements will produce the desired frequency response when a different one of the sampling circuits contains a new sample of the input signal; a plurality of switches, each switch connecting one of the plurality of sets of elements to either a virtual ground of the output or to a ground.

DETAILED DESCRIPTION OF THE INVENTION

The present application, describes the design and implementation of a filter that has the output of a finite impulse response (FIR) filter without the need for delay elements, a large number of switches, or active buffers.

One known way of avoiding passing an analog signal down a delay line is by the use of a so-called "rotating coefficient" FIR filter. In a FIR filter of this type, the samples of the input signal are taken by a plurality of sample and hold circuits in a "round robin" fashion rather than being passed from one delay element to another. Once a sample is loaded into a given sample and hold circuit, it need not be passed to successive sample and hold circuits since the coefficients are made to rotate to the correct values as required.

U.S. Pat. No. 7,028,070 ("the '070 patent"), entitled "High Speed Filter" (as well as the continuation of the '070 patent, U.S. Pat. No. 8,001,172) describes such a circuit that operates by using a series of sampling elements activated in a "round-robin" fashion and thus provides an alternative way of obtaining a discrete approximation to a Fourier integral of a signal using a substantially analog signal processing array. The '070 patent is incorporated herein by reference as though set forth in full.

Figure 3:
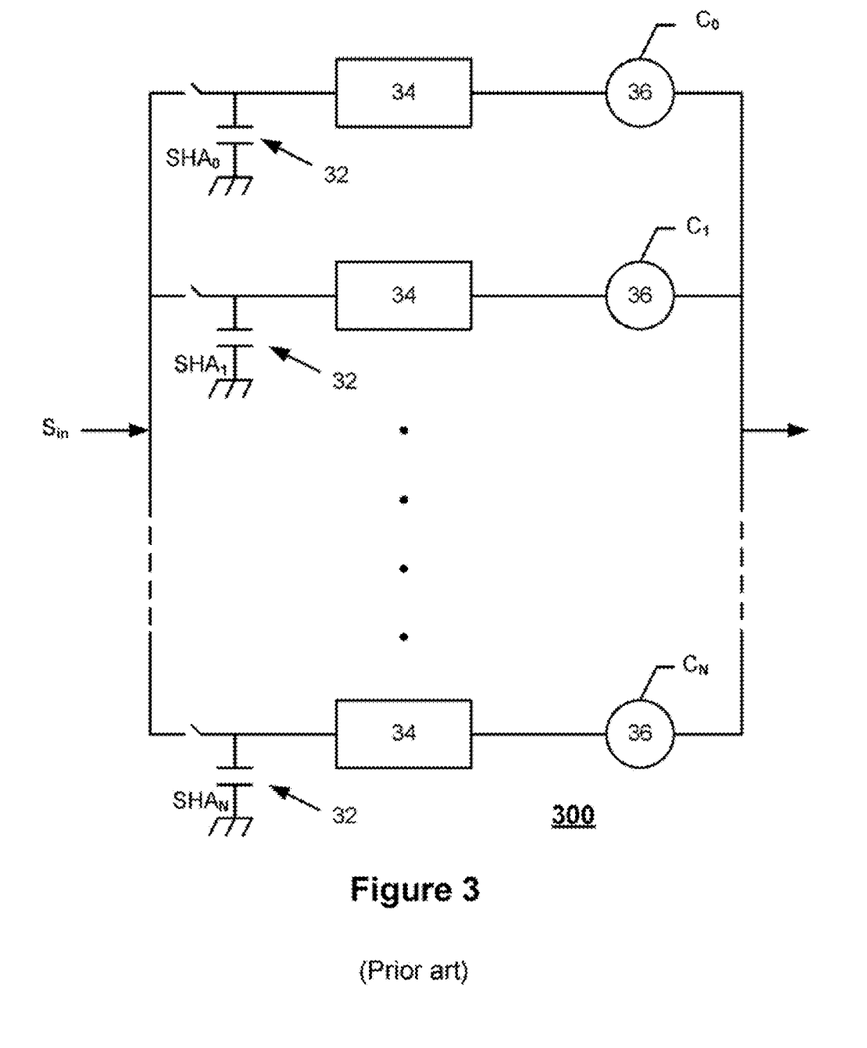
FIG. 3 is a block diagram of one embodiment of a prior art round robin sampling circuit that can function as a rotating coefficient FIR filter.

FIG. 3 is a block diagram of one embodiment of such a prior art round robin circuit. Circuit 300 contains a plurality N of sample and hold amplifiers (SHAs) 32 and an equal number N of multipliers 36. The number N is considered to be the "length" of the filter. An equal number N of identical optional filter elements 34 is shown; one of skill in the art will appreciate that such filter elements may be used in certain applications, such as that shown in co-pending U.S. patent application Ser. No. 13/668,253, commonly owned by the assignee of the present application.

An input signal $S_{IN}$ is applied to the SHAs 32 in parallel, rather than being passed from one SHA to the next, but each SHA 32 is activated in sequence so as to operate in a round-robin order. Specifically, a first SHA 32 (labeled $SHA_0$) is first activated to sample the signal $S_{IN}$, then a second SHA 32 ($SHA_1$) is activated to sample $S_{IN}$, then $SHA_2$ is activated, etc, up to $SHA_N$. After all of the SHAs have been activated in sequence, $SHA_0$ is activated again, then $SHA_1$ is activated again, etc.

The output of each of these samples taken by the round-robin action of the SHAs 32 is fed to one of the filters 34 if the filters are used, and then to a corresponding multiplier 36 as shown. In addition to the filtered output, each of the N multipliers receives a second input value $C_0$ to $C_N$ representing a coefficient of the Fourier series approximation of a desired signal to be mixed with the input signal.

It will be appreciated that each SHA 32 may now operate at a lower frequency than would be required for a single analog-to-digital converter (ADC) in a traditional FIR filter; specifically, the desired sampling interval of a single ADC is multiplied by the number of SHAs in circuit 300, and the required frequency of operation is similarly divided by the number of SHAs present.

The coefficients $C_0$ to $C_N$ input to multipliers 36 are rotated from one multiplier 36 to the next at the sampling rate, so that each sample captured by an SHA 32 will be successively multiplied by each coefficient at successive intervals. Thus, in operation the circuit 300 acts like a conventional FIR filter.

Figure 4:
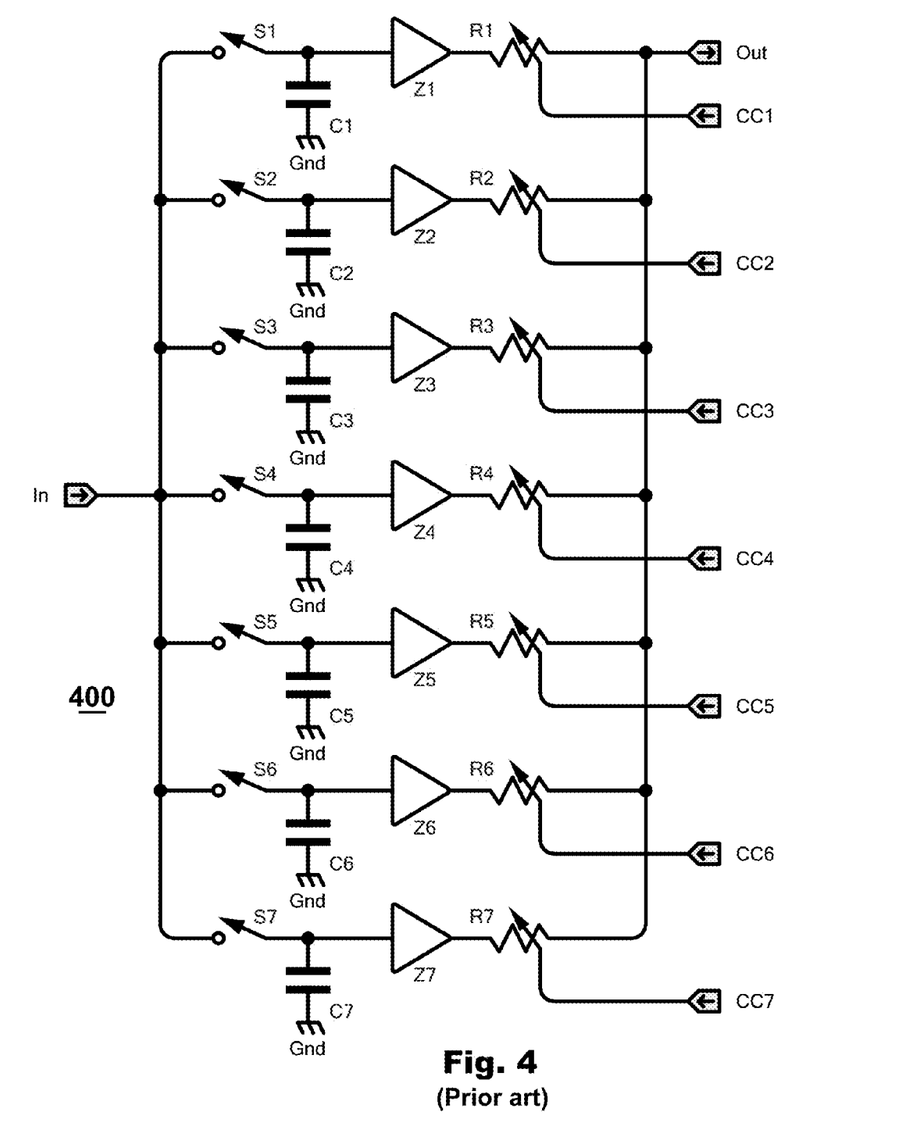
FIG. 4 is a schematic diagram of one embodiment of a prior art rotating coefficient FIR filter.

FIG. 4 is a schematic diagram of one implementation of a circuit such as that shown in FIG. 3. In circuit 400, switches S1 to S7 close and open sequentially to distribute the input signal to the sample and hold capacitors C1 to C7 in a round robin fashion. As this is done, the coefficient control signals CC1 to CC7 set the appropriate coefficient values corresponding to the current step in the round robin sampling by adjusting variable resistors (or other impedance elements) R1 to R7, to which the samples are passed through buffers Z1 to Z7. For simplicity, an $8^{th}$ order filter is shown in FIG. 4, as in FIG. 2, although again the filter can be of any desired order.

In operation, switch S1 will close first, storing the current input signal on sample and hold capacitor C1, after which switch S1 will open. After an interval, switch S2 will close, so that the new current sample of the input signal is stored on capacitor C2, after which switch S2 will open, while capacitor C1 now holds the input signal sample from one interval prior. After another interval, switch S3 will, close to store the next sample on capacitor C3, etc.

The seventh sample will be stored on capacitor C7, with capacitor C1 now holding the oldest sample. At this point the coefficient control signals CC1 to CC7 will configure resistors R1 to R7 such that R7 is the inverse of the first desired coefficient value, R6 is the inverse of the second coefficient value, R5 the inverse of the third coefficient value, etc. The coefficients will thus appear in order on resistors R7, R6, R5, R4, R3, R2, and R1, respectively. Thus, as in the block diagram circuit of FIG. 3, the newest sample is effectively multiplied by the first coefficient, the next sample by the second coefficient, and the oldest sample by the last coefficient.

Since C7 is the last capacitor for storing a sample, in "round-robin" operation the next, i.e., eighth, sample will be stored on capacitor C1, so that it again has the newest sample, while C7 has the sample from one interval prior, C6 has the sample from two intervals prior, etc. Now the resistors should be adjusted so that R1 is the inverse of the first coefficient value, R7 the inverse of the second coefficient value, R6 the inverse of the third coefficient value, and so on, so that the coefficients will appear in order on resistors R1, R7, R6, R5, R4, R3, and R2, respectively.

This rotation of the resistor values continues with each new sample so that the resistor to coefficient mapping is always in an order that results in the newest sample being effectively multiplied by the first coefficient value, the next newest sample by the second coefficient value, etc.

While this form of rotating coefficient filter will work and avoids the need for delay elements, the need to constantly adjust the coefficient values leads to some practical problems. There are digital busses driving the adjustable elements (here resistors), and these busses have associated noise; this noise tends to couple into, and thus degrade, the desired output signal. In addition, such a system may be complex, as each variable "resistor" (in this case) R1 to R7 is actually a set of resistors with as many as ten or twelve switches to implement the adjustment in the resistor values described above. (There will, generally be as many switches as there are bits in the control signal, so that for a ten bit accurate adjustment this would be ten switches for each resistive element, etc.)

Thus, it is desirable to make a rotating coefficient filter without requiring adjustable coefficient values, and with a minimum number of switches to reduce the noise that is injected into the digital output signal.

Figure 5:
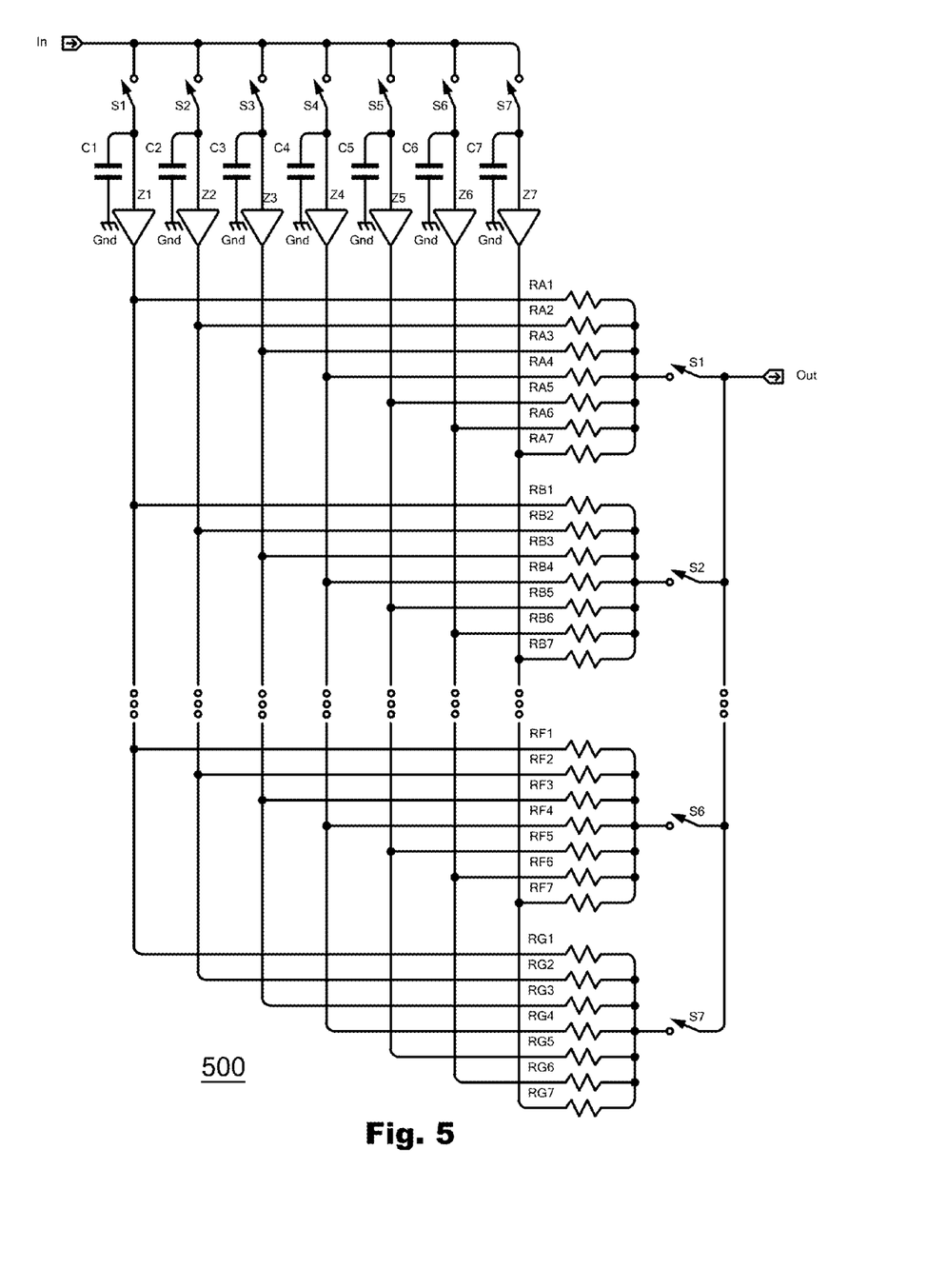
FIG. 5 is a schematic diagram of one embodiment of a circuit that provides a rotating coefficient FIR filter without adjustable elements and with a reduced number of switches.

FIG. 5 shows one embodiment of a circuit that provides a rotating coefficient FIR filter without adjustable elements and with a reduced number of switches. Circuit 500 of FIG. 5 implements the same functionality as that of circuit 400 in FIG. 4.

Switches S1 to S7 and sample and hold capacitors C1 to C7 again sample the input signal in a round robin fashion as above, and the samples pass through buffers Z1 to Z7 to a resistive network. Now, however, rather than adjustable elements, there are seven sets of resistors, representing seven sets of coefficient values, with each set having seven resistors. Each set of seven resistors may be coupled to the output by one of switches Y1 to Y7, and correctly implements the coefficients needed for one step of the determination of the desired output.

Thus, resistors RA1 to RA7 are pre-selected as the inverses of the appropriate coefficients that are desired to be applied when switch S1 has just closed and capacitor C1 holds the current sample. Similarly, resistors RB1 to RB7 are the inverses of the coefficients desired when switch S2 has just closed and capacitor C2 holds the now current sample, etc.

This means that the seven resistors RB1 to RB7 will have the same overall values as resistors RA1 to RA7, but the order will be rotated by one, so that RB2 will be the same value as RA1 (since the current sample is now from C2 rather than C1), RB3 will be the same value as RA2, etc., and RB1 will be the same value as RA7. The changing of the order of the resistor values from one set of resistors to the next effectively creates the rotation of coefficients accomplished by the adjustable resistors in FIG. 4.

It can thus be seen that no adjustment of the resistor values is needed, since all of the desired values are already present. All that is required is that the correct set of resistors be pre-selected and connected to the output by closing the appropriate switch Y1 to Y7. This is done by closing one of switches Y1 to Y7 synchronously with the closing of each of switches S1 to S7.

For example, when a first sample is taken, switches S1 and Y1 are closed, and all other switches are open. When the second sample is taken, switches S2 and Y2 are closed, and all other switches are open, etc., until the seventh sample is taken with switches S7 and Y7 closed and all other switches open. For the eighth sample, again switches S1 and Y1 are closed and all other switches are open.

A rotating coefficient FIR filter may be made in this way using only a round-robin sampler, with no delay elements or adjustable elements, and a minimum number of switches that operate at the same frequency as the switches that sample the input signal. All coefficients are always present, and only implemented by the closing of the appropriate switch connecting the desired set of coefficients (resistors) to the output.

Such a circuit is easier to manufacture than one using adjustable elements. Each resistor represents a coefficient, and where possible may be made as a single resistor. In some cases it may be more convenient to create a resistive value from a plurality of resistors; however, even where this is done, no additional switch is required, thus reducing the possibility of noise in the output signal.

It may be seen that one limitation of circuit 500 of FIG. 5 is that in circuits with large numbers of coefficients, the number of resistors increases as the square of the order of the filter. Thus, in a 101th order filter having 100 coefficients, there will be 100 sets of resistors, each having 100 resistors, for at total of 10,000 resistors, and each resistor requires space on, for example, an integrated circuit.

In some specific cases, it is not necessary to include all possible sets of coefficients, and thus the number of sets of resistors, and the total number of resistors, may be reduced. For example, a rotating coefficient FIR filter may be used as an anti-aliasing filter of some kind to restrict the bandwidth of the input signal in certain digital signal processing applications. In such cases, and other applications of a similar nature, the output signal rate does not always need to equal the input signal rate.

For example, where such a filter is used as a channel selected filter for an FM radio, the input signal may be of a frequency up to 100 MHz, thus requiring a sample rate of 200 megasamples per second (MS/s). However, only signals the 10 MHz range are desired in the output band. Thus, the output data rate may be as low as 40 MS/s and still adequately represent the required 10 MHz output. This corresponds to an under-sampling of the output by a factor of five (40 MS/s compared to 200 MS/s). In such a case of under-sampling of the output, the number of input samplers may be selected to be a multiple of the number of output values, thus allowing for the omission of sets of coefficients, and thus resistors, which will not be used.

Figure 6:
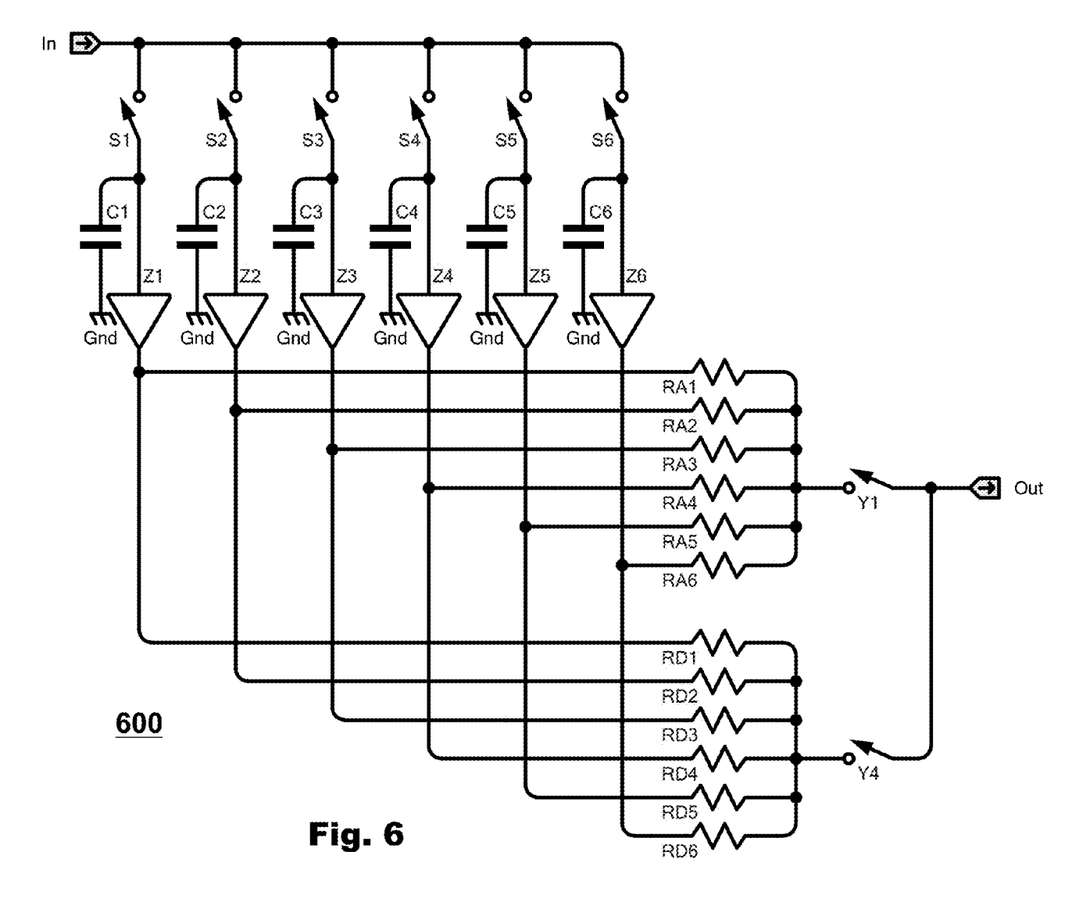
FIG. 6 is a schematic diagram of another embodiment of a circuit that provides a rotating coefficient FIR filter without adjustable elements and with a reduced number of switches in a case where the output is under-sampled compared to the input.

An example of this is shown in circuit 600 of FIG. 6. In circuit 600, an under-sampling factor of three is assumed. Thus, while there are six samplers (six switches S1 to S6 and capacitors C1 to c6), since the output will only be sampled at every third input sample, only two sets of output coefficients are required. It is assumed here that the output will be sampled when the first and fourth input samples are taken, i.e., when switches S1 and S4 are closed.

A circuit such as that shown in FIG. 5 above would have six sets of six resistors and six output switches Y1 to Y6 operating synchronously with switches S1 to S6. However, since the output is only sampled as input samples are taken by switches S1 and S4, it will be apparent that four of the sets of six resistors and the associated output switches Y2, Y3, Y5 and Y6 will never be needed. They may thus be omitted from the circuit altogether, reducing the cost and difficulty of manufacture, as well as the space required.

Figure 7:
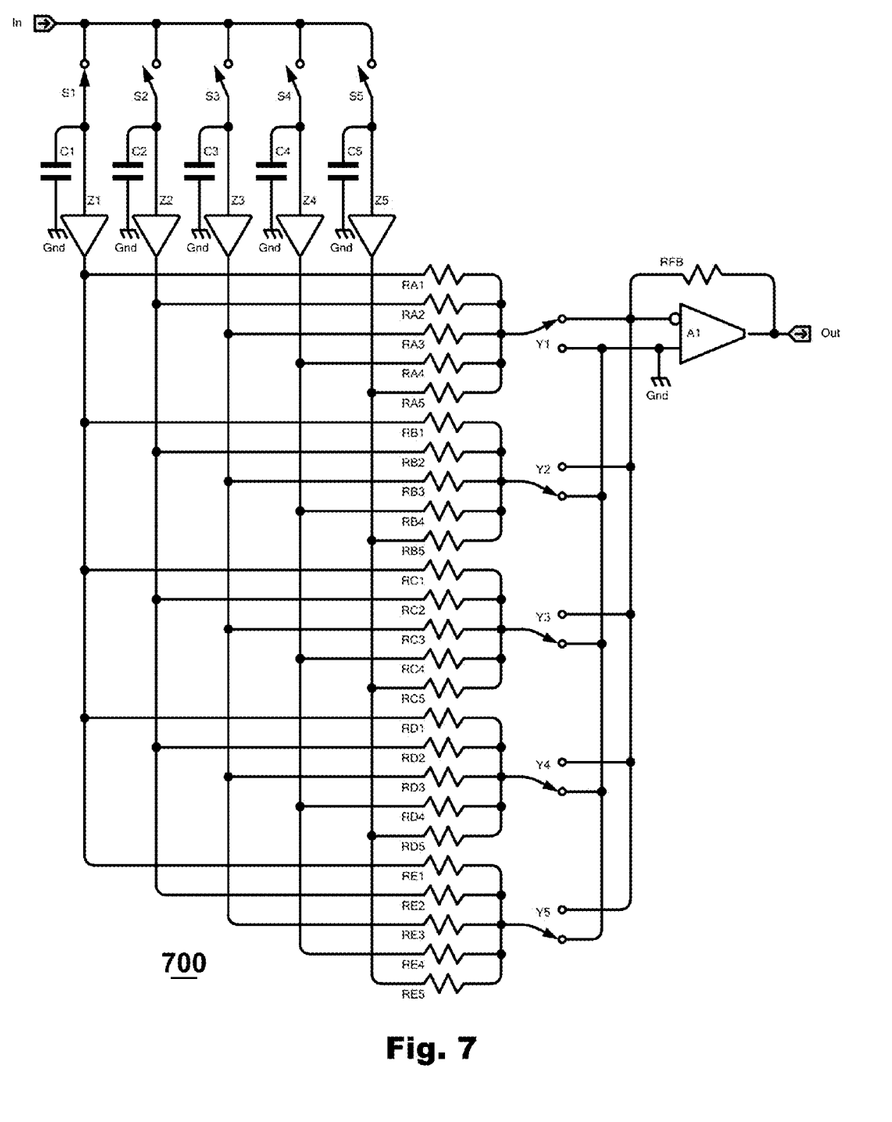
FIG. 7 is a schematic diagram of another embodiment of a rotating coefficient filter having a substantially constant load.

In the circuits above, the Z buffers serve to isolate the capacitors storing the samples of the input signal from the load imposed by the resistors. FIG. 7 is a schematic diagram of another embodiment of a rotating coefficient filter in which the load is made substantially constant.

Circuit 700 of FIG. 7, like circuit 500 in FIG. 5, has multiple sets of resistors in rotating order to provide coefficients that effectively rotate as switches S1 to S5 are closed and new samples of the input signal are successively obtained by capacitors C1 to C5. Since circuit 700 has only five sample and hold elements, i.e., five switches S1 to S5 and five capacitors C1 to C5, there are five sets of resistors RA to RE, each set having 5 resistors, and five output switches Y1 to Y5.

It will be appreciated that in circuit 700, as in circuit 500 above, the sample passed through a buffer Z1 to Z5 will always see the same load, due to the rotation of the order of the resistors. For example, the load on the buffer Z1 is the parallel combination of the resistors RA1, RB1, RC1, RD1 and RE1, which as above have the same values as resistors RB2, RC2, RD2, RE2 and RA2, which produce the load on buffer Z2.

By contrast with circuit 500 of FIG. 5, in circuit 700 switches Y1 to Y5 now do not lead directly to an output terminal. Rather, switches Y1 to Y5 now connect the output to either a real ground or a virtual ground, which correspond to the inverting and non-inverting inputs of a ground amplifier A1. The switching of any of switches Y1 to Y5 (which still corresponds to the switching of switches S1 to S5 as above) now does not significantly disturb the load on buffers Z1 to Z5. More importantly, there is no signal on the output node; it is held at ground by the action of the amplifier. Thus, the load seen by the buffers Z is the same independent of whether the Y switch is open or closed. The Y switches either connect to the real ground or to the virtual ground of the amplifier.

As above, the buffers Z1 to Z5 served to isolate the capacitors from the load; however, the load is now constant. If the Z buffers are removed, the charge stored on a capacitor, and thus the "value" stored, will begin to decay exponentially independently of whether the corresponding switch is opened or closed.

Figure 8:
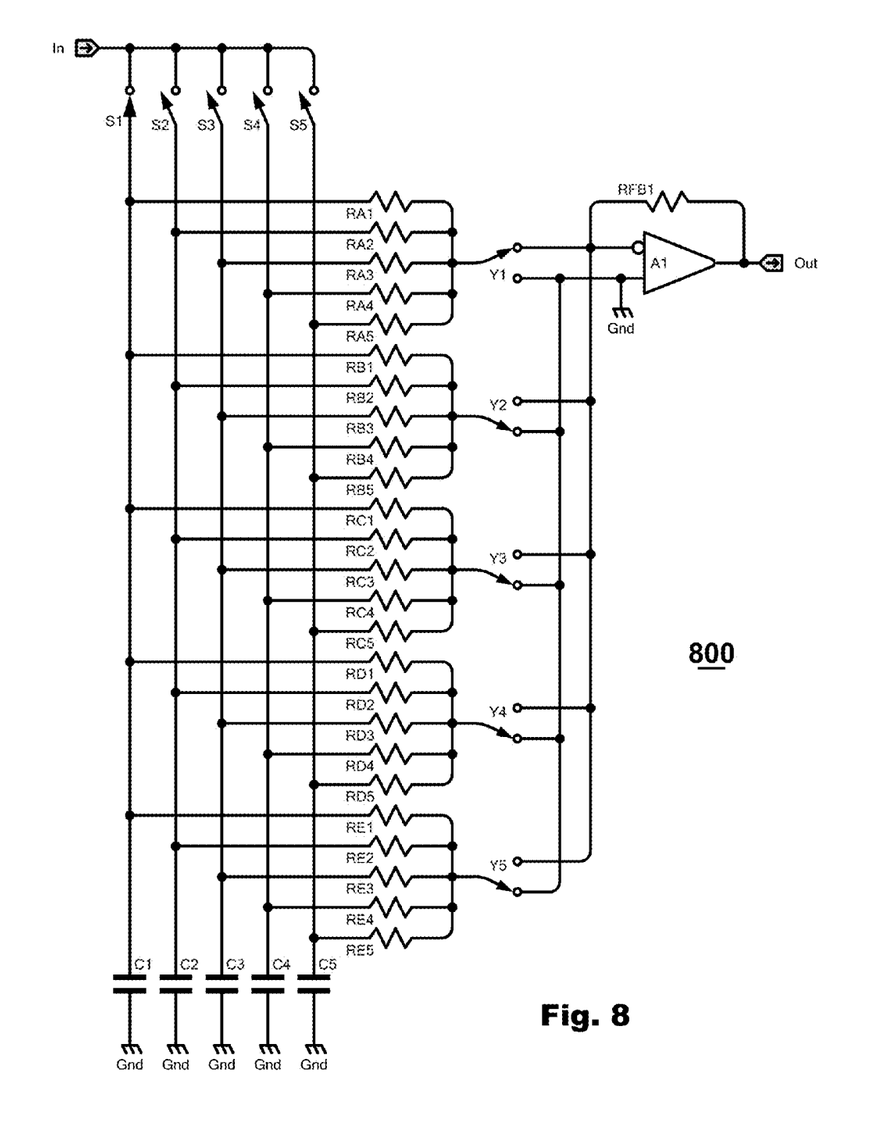
FIG. 8 is a schematic diagram of another embodiment of a rotating coefficient filter without signal buffers.

FIG. 8 is a schematic diagram of another embodiment of a rotating coefficient filter; circuit 800 is the same as circuit 700 of FIG. 7, except that the buffers Z1 to Z5 have been removed, and the capacitors C1 to C5 illustrated at the bottom of the circuit.

Thus, suppose capacitor C1 stores a first sample of the input signal. When the next sample is taken by the capacitor C2, the value stored on capacitor C1 is not the same value that was stored one sample interval before, but has decayed to some fraction of that value. Similarly, when a third sample is taken by capacitor C3, the value on capacitor C2 has decayed for one sample interval, while the value on capacitor C1 has decayed even further.

Specifically, assuming that $R_{LOAD}$ is the effective load resistance, i.e., the parallel combination of the resistors connected to a single switch (such as RA1, RB1, RC1, RD1 and RE1 connected to switch S1), ts is the time between samples, and $C_{SAM}$ is the value of the sampling capacitor, then the successive samples of the signal are no longer just $S_i$, but rather $$S_i \cdot e^{\left(\frac{-i \cdot t_S}{R_{LOAD} \cdot C_{SAM}}\right)}$$

i.e., each sample has decayed exponentially by an amount that depends on how long ago the sample was taken and the effective RC constant. However, the amount of decay does not depend upon what the signal is, and will occur for any signal sample $S_i$ having a value (i.e., other than a signal of zero).

Since the decay of a sample is not in any way dependent upon the signal being sampled, it is thus possible to compensate for the decay by changing the coefficients to be used, and thus the values of the resistors in circuit 800. If the initial coefficient choices are $C_i$, then to compensate for the decay above the coefficients are to be modified to be $$C_i \cdot e^{\left(\frac{-i \cdot t_S}{R_{LOAD} \cdot C_{SAM}}\right)}$$

This new set of coefficients will change the $R_{LOAD}$ value, which as above depends upon the parallel combination of all of the resistor values, which in turn are the inverse of the coefficients, which are to be changed by the above formula. In practice, it is believed that it will prove easiest to iterate the correction until the coefficients converge to a fixed set of values.

Figure 9:
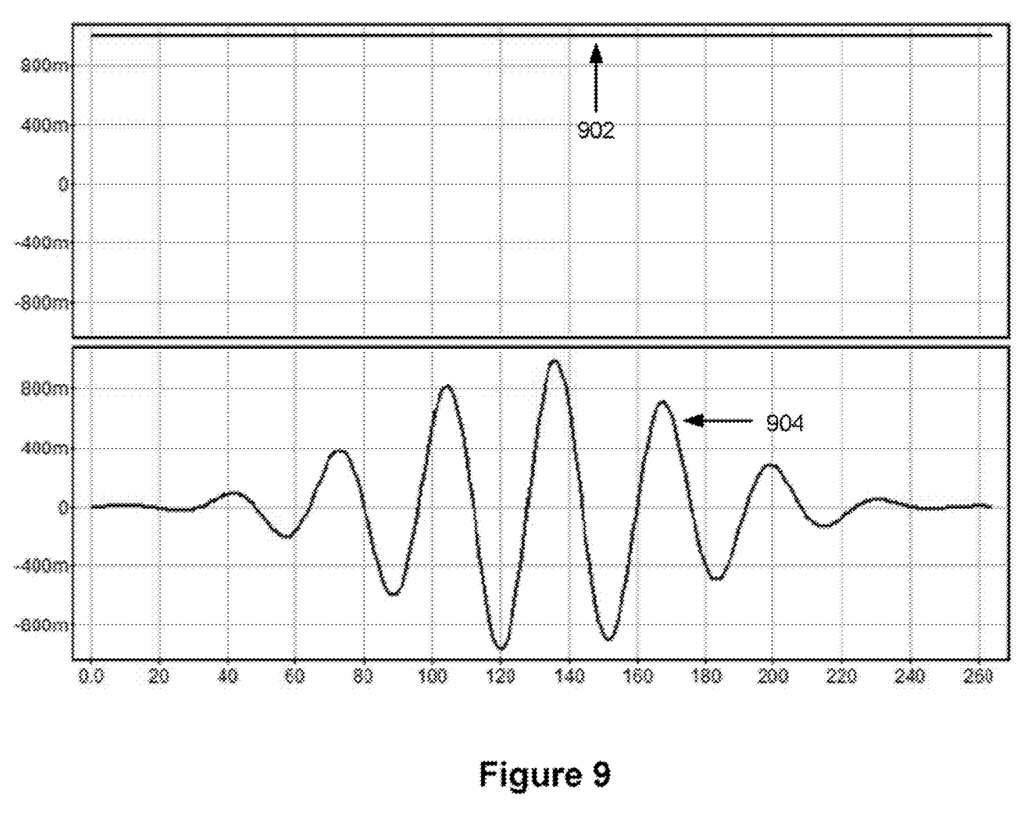
FIG. 9 is a graph showing a constant input signal and a possible set of Fourier coefficients.
Figure 10:
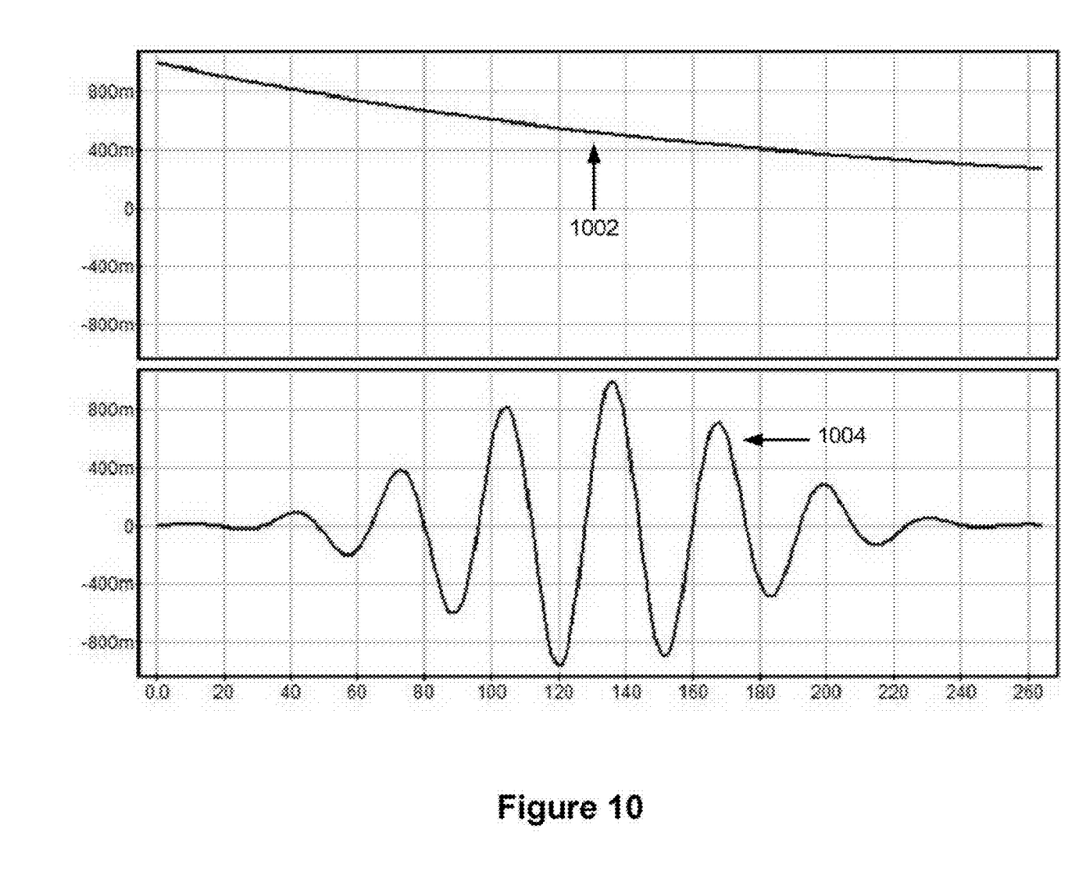
FIG. 10 is a graph showing an exponentially decaying input signal and the set of Fourier coefficients of FIG. 9.
Figure 11:
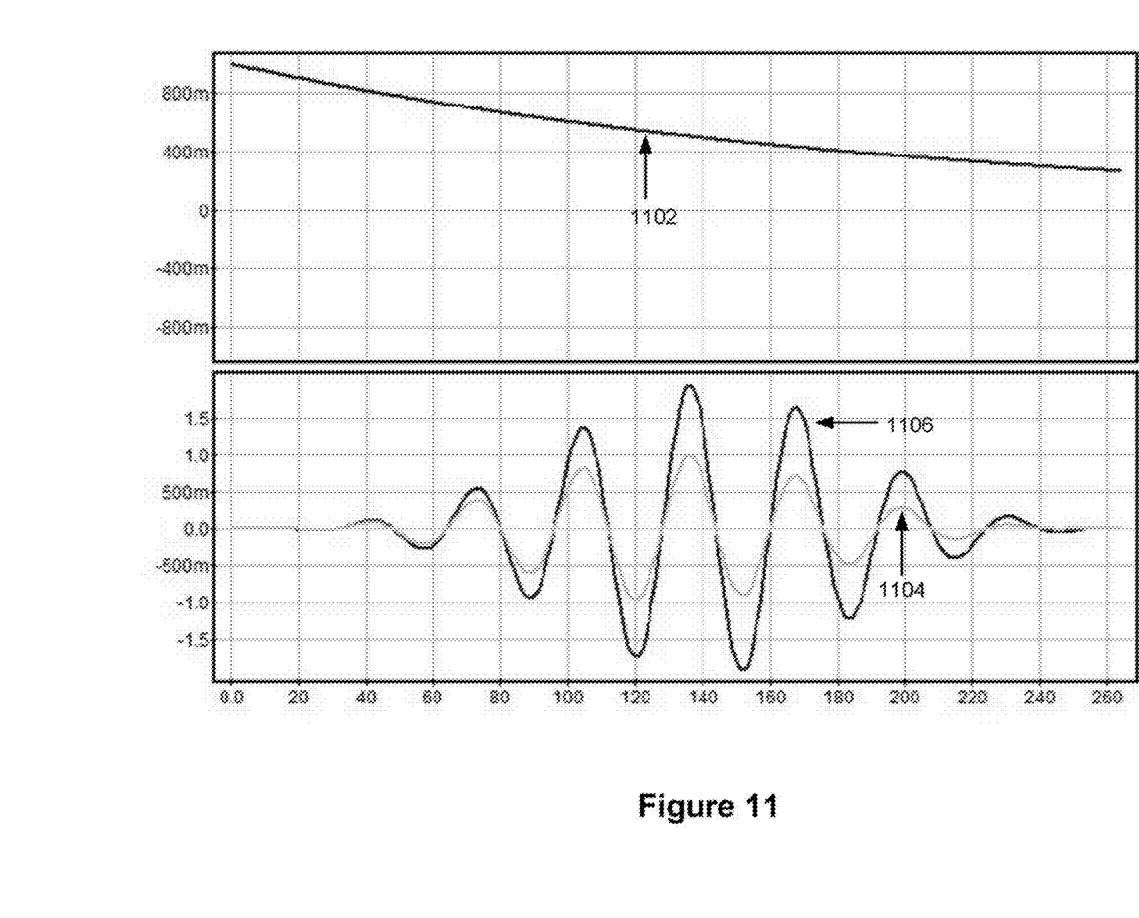
FIG. 11 is a graph showing an exponentially decaying input signal and a set of Fourier coefficients adjusted to provide a desired output.

FIGS. 9 through 11 illustrate graphically how this is achieved in practice. FIG. 9 shows two graphs. The upper graph 902 is a curve showing the amplitude of a series of samples of an input signal taken over time as they would be in a conventional delay line filter, or a circuit containing buffers as above. (The x-axis is time, or the number of samples, depending upon the interval selected between samples; here, for example, the x-axis indicates 260 samples.) Each sample is here assumed to have a constant value of 1; when connected, the samples form a line of that value. Thus, regardless of the interval between samples along this line, each sample will have a value of 1. The lower graph 904 shows a set of coefficients represented as a waveform, as is commonly done; one of skill in the art will understand that a set of, for example, 260 coefficients, are selected by taking 260 values from the illustrated curve at equal axis intervals, while a smaller set of 100 coefficients would be selected by taking 100 values from the curve at greater intervals.

FIG. 10 shows a curve of the amplitude of the same samples over time in the case where there is exponential decay of the samples as above due to the lack of buffering. The upper graph 1002 thus represents a loss of signal at any given time versus the time the sample was taken. The sample at time 0 is correct, as it has not yet decayed, but the longer the time since the sample was taken (the x-axis), the smaller the value of the sample becomes. Thus, as illustrated, at time (or sample) 240, the sample from time 0 has decayed to less than 0.4 times (or 40% of) its original value.

The coefficients in curve 1004 are the same as in curve 904; thus, if the samples are multiplied by the shown coefficients and the products then summed, the result will not be the same as for the samples shown in FIG. 9. This error is caused by the uncompensated decay in the samples compared to those shown in FIG. 9.

FIG. 11 shows how changing the coefficients can compensate for the decay in the sample values. Curve 1102 again shows decaying samples as in curve 1002. Curve 1104 shows the same coefficient values as curve 1004 above (note that the scale on the y-axis has changed). An adjusted set of coefficient values is shown in curve 1106. The adjusted coefficient values are selected to grow exponentially so as to compensate for the exponential decay of the samples as explained above, so that multiplying each sample by the coefficients and then summing the products will produce the same result as those operations applied to the undecayed samples and unadjusted coefficients of FIG. 9.

It may be seen that, as expected, the adjusted coefficients remain close to the unadjusted coefficients at times close to 0, and the difference becomes progressively larger as time passes, just as the amount of decay of the samples increases over time. At each point, the coefficients will be increased by the amount needed to compensate for the decay at the same point.

Thus, in this example, if there are 260 samples and coefficients as above, at about time 40 on the x-axis, i.e., after 40 samples and intervals, the first sample has decayed to about 80% of its original value. To compensate, the $40^{th}$ coefficient will be about 25% larger than the unadjusted coefficient, so that the product of (0.8*original sample) and (1.25*unadjusted coefficient) will be the same as the original sample times the unadjusted coefficient. Similarly, when the sample has decayed to about half of its original value, as shown here somewhere around time 150, the adjusted coefficient will be double the unadjusted value at the same time. Thus, the percentage difference between the unadjusted coefficients of curve 1104 and the adjusted coefficients of curve 1106 will get larger as the coefficient curve moves along the x-axis.

Because the described embodiment of a FIR filter uses a separate set of resistors for each sample point in the cycle, as is necessary to take samples of an analog signal in a round robin fashion, it is always possible to compensate for the exponential decay caused by not buffering the samples. Implementing a filter in this way allows the filter to be purely passive, i.e., it is constructed solely from passive components and switches as shown here. This allows the filter to use a lower amount of power then a filter with active components. In addition, the filter shows no artifacts due to an buffer offset mismatch, as is common in active filters.

The disclosed system and method has been explained above with reference to several embodiments. Other embodiments will be apparent to those skilled in the art in light of this disclosure. Certain aspects of the described method and apparatus may readily be implemented using configurations or steps other than those described in the embodiments above, or in conjunction with elements other than or in addition to those described above.

For example, as discussed above, the elements providing the desired impedance values need not be resistors, but may be, for example, capacitors, inductors or FETs connected as pass devices, depletion mode MOSFETs, or other devices, with the values of the elements (such as capacitance, inductance, etc) selected to provide the desired impedance values.

It should also be appreciated that the described method and apparatus can be implemented in numerous ways, including as a process, an apparatus, or a system. The methods described herein may be implemented by program instructions for instructing a processor to perform such methods, and such instructions recorded on a computer readable storage medium such as a hard disk drive, floppy disk, optical disc such as a compact disc (CD) or digital versatile disc (DVD), flash memory, etc. The methods may also be incorporated into hard-wired logic if desired. It should be noted that the order of the steps of the methods described herein may be altered and still be within the scope of the disclosure.

These and other variations upon the embodiments are intended to be covered by the present disclosure, which is limited only by the appended claims.

What is claimed is:

1. A circuit comprising:
an input configured to receive an input signal;
a plurality of sampling circuits arranged in parallel for sampling the input signal in response to a timing signal, each sampling circuit consisting of a capacitor and a switch that connects the capacitor to the input signal, the sampling circuits configured such that successive sampling circuits create samples of the input signal in time-delayed succession at pre-determined intervals;
a plurality of sets of elements having impedances,
each set containing the same number of elements as the number of sampling circuits with the impedances chosen as the inverses of a set of coefficients having values that produces a desired frequency response to the input signal and adjusted to compensate for an exponential decay in the samples such that the coefficients are increased exponentially from the original values at the same rate between successive coefficients as the rate of decay of a sample over one interval, so that the sum of outputs from the elements in each set produces a desired frequency response to the input signal that is the same for each set,
with each element in a set connected without a buffer to a different one of the sampling circuits in a different order from the connection of the elements in each other set, such that each set of elements will produce the desired frequency response when a different one of the sampling circuits contains a new sample of the input signal; and a plurality of switches, each switch connecting one of the plurality of sets of elements to either a virtual ground of the output or to a ground.

2. The circuit of claim 1 wherein the number of sets of elements having impedances is the same as the number of sampling circuits.

3. The circuit of claim 1 wherein the number of sets of elements having impedances is less than the number of sampling circuits.

4. The circuit of claim 1 wherein the elements having impedances are resistors.

5. The circuit of claim 1 wherein the elements having impedances are capacitors.

6. The circuit of claim wherein the elements having impedances are inductors.

7. The circuit of claim 1 wherein the elements having impedances are transistors.

8. A method of designing a finite impulse response filter having a plurality of sampling circuits arranged in parallel for sampling the input signal in response to a timing signal, each sampling circuit consisting of a capacitor and a switch that connects the capacitor to the input signal, the sampling circuits configured such that successive sampling circuits create samples of the input signal in time-delayed succession at pre-determined intervals, comprising:

selecting a desired frequency response for the filter;

selecting a plurality of sets of elements having impedances, each set containing the same number of elements as the number of sampling circuits with the impedances chosen as the inverses of a set of coefficients having values that produces a desired frequency response to the input signal and adjusted to compensate for an exponential decay in the samples such that the coefficients are increased exponentially from the original values at the same rate between successive coefficients as the rate of decay of a sample over one interval, so that the sum of outputs from the elements in each set produces a desired frequency response to the input signal that is the same for all of the sets, with each element in a set to be connected without a buffer to a different one of the sampling circuits in a different order from the connection of the elements in each other set, such that each set of elements will produce the desired frequency response when a different one of the sampling circuits contains a new sample of the input signal; and for each set of elements, providing a switch connecting the set of elements either to a virtual ground of an output or to a ground, each switch being separate from the switches connected to the other sets of elements.

9. The method of claim 8, wherein selecting a plurality of sets of elements further comprises:

determining a set of Fourier coefficients that produces the desired frequency response; and selecting a set of impedances that are the inverse of the Fourier coefficients.

10. The method of claim 9, wherein determining a set of Fourier coefficients further comprises mathematically calculating the set of Fourier coefficients.

11. The method of claim 9, wherein determining a set of Fourier coefficients further comprises determining the set of Fourier coefficients by an iterative method.

12. The method of claim 11, wherein determining the set of Fourier coefficients by an iterative method further comprises determining the Fourier coefficients by a Parks-McClellan method.

13. The method of claim 11, wherein determining the set of Fourier coefficients by an iterative method further comprises determining a set of Fourier coefficients by an iterative method performed by software that receives the desired frequency response for the filter as an input.

14. A computer readable storage medium having embodied thereon instructions for causing a computing device to execute a method for designing a finite impulse response filter having a plurality of sampling circuits arranged in parallel for sampling the input signal in response to a timing signal, each sampling circuit consisting of a capacitor and a switch that connects the capacitor to the input signal, the sampling circuits configured such that successive sampling circuits create samples of the input signal in time-delayed succession at pre-determined intervals, the method comprising:

selecting a desired frequency response for the filter;

selecting a plurality of sets of elements having impedances, each set containing the same number of elements as the number of sampling circuits with the impedances chosen as the inverses of a set of coefficients having values that produces a desired frequency response to the input signal and adjusted to compensate for an exponential decay in the samples such that the coefficients are increased exponentially from the original values at the same rate between successive coefficients as the rate of decay of a sample over one interval, so that the sum of outputs from the elements in each set produces a desired frequency response to the input signal that is the same for all of the sets, with each element in a set to be connected without a buffer to a different one of the sampling circuits in a different order from the connection of the elements in each other set, such that each set of elements will produce the desired frequency response when a different one of the sampling circuits contains a new sample of the input signal; and for each set of elements, providing a switch connecting the set of elements either to a virtual ground of an output or to a ground, each switch being separate from the switches connected to the other sets of elements.

* * * * *